(12) United States Patent
Kudo

(10) Patent No.: US 7,183,814 B2
(45) Date of Patent: Feb. 27, 2007

(54) SAMPLING SWITCH

(75) Inventor: Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/023,010

(22) Filed: Dec. 28, 2004

(65) Prior Publication Data
US 2005/0258874 A1 Nov. 24, 2005

(30) Foreign Application Priority Data
May 20, 2004 (JP) .............................. 2004-150571

(51) Int. Cl.
*G11C 27/02* (2006.01)
(52) U.S. Cl. ..................................... 327/91
(58) Field of Classification Search ................ 327/91, 327/94, 427, 589, 337, 389, 390
See application file for complete search history.

(56) References Cited

U.S. PATENT DOCUMENTS 5,500,612 A * 3/1996 Sauer ........................... 327/91
6,323,697 B1 * 11/2001 Pavan .......................... 327/94
6,525,574 B1 * 2/2003 Herrera ......................... 327/94
6,833,753 B2 * 12/2004 Das .............................. 327/536

FOREIGN PATENT DOCUMENTS

JP 05-151795 6/1993

OTHER PUBLICATIONS

Abo, Andrew M., et al., A 1.5-V, 10-bit, 14.3-MS/s CMOS Pipeline Analog-to-Digital Converter, IEEE Journal of Solid-State Circuit, vol. 34, No. 5, May 1999, pp. 599-606.
Waltari et al., "A Self-Calibrated Pipeline ADC with 200 MHz IF-Sampling Frontend", ISSCC Digest of Technical Papers, 18.5 (2002).

* cited by examiner

Primary Examiner—My-Trang Nu Ton
(74) Attorney, Agent, or Firm—Arent Fox PLLC

(57) ABSTRACT

A sampling switch is the one for sampling an input voltage and providing an output voltage, comprising a MOS transistor for being supplied by the input voltage to the source terminal thereof and providing the output voltage from the drain terminal thereof; and a gate voltage control unit for supplying a voltage to the gate terminal of the MOS transistor with a delayed time from the input voltage. This enables a change in the on-resistance of a MOS transistor used for a sampling switch to be suppressed to a minimum, thereby reducing a distortion of signals induced by a change in the on-resistance.

16 Claims, 14 Drawing Sheets

| $\overline{\phi}$ | A | B | X | G |
|---|---|---|---|---|
| Vdd | Vss | Vdd | Vdd | Vss |
| Vss | Vin | Vin + Vdd | Vin | Vin + Vdd |

F I G. 9

SAMPLING SWITCH

CROSS-REFERENCE TO RELATED APPLICATIONS

This application is based upon and claims the benefit of priority from the prior Japanese Patent Application No.2004-150571, filed in May, 20, 2004, the entire contents of which are incorporated herein by reference.

BACKGROUND OF THE INVENTION

1. Field of the Invention

The present invention relates to a sampling switch used for an analog signal processing, specifically to a sampling switch capable of reducing a distortion in a signal wave form caused by a variation of on-resistance thereof being unaffected by a fluctuation of the input voltage thereto.

2. Description of the Related Art

Sampling switches are widely used for the analog signal processing such as a sample hold circuit, a switched capacitor circuit and an analog-to-digital ("A/D" hereinafter) converter. An important property of such a switch used in the signal path for an analog signal is that the on-resistance thereof does not cause a distortion in the signal wave form. For example, if a signal wave form is deformed by a sampling switch sampling an analog signal in an A/D converter, that is, if the wave form of the input signal is changed from that of an input signal, the conversion characteristics of the A/D converter will be impaired.

FIG. 1 shows a MOS transistor as a first conventional example of sampling switch. While the MOS transistor is widely used for switches, an on-resistance value thereof in the on-state depends on a voltage between the gate and source (voltage between the gate and drain), and a voltage between the substrate and the source.

Generally, a control voltage $\phi$ and a substrate terminal voltage applied to the gate terminal are constant independent of an input signal voltage, and the on-resistance of a switch changes depending on the input signal voltage. A delay time of the input signal going through a switch is in a close relation with a time constant which is determined by the on-resistance of the switch and a capacitance of the load, and a delay time of the output signal changes in accordance with the input signal voltage when the on-resistance of the switch depends on the input signal voltage.

This makes a wave form of the output signal in passage through the switch changed from that of the input signal prior to the passage. Lowering the operating voltage of a circuit and a high speed signal processing have a more significant impact on the input signal voltage. And it is required a technology for overcoming the above described problem.

A MOS transistor switch utilizing a bootstrap circuit is known as a technique for avoiding distortion to a signal by maintaining the on-resistance of a sampling switch constant. FIG. 2 shows a second example of such conventional sampling switch, which is seen in the following reference document.

[Non-patent document 1] A. M. Abo, P. R. Gray: A 1.5-V, 10-bit, 14.3 MS/s CMOS Pipeline Analog-to-Digital Converter, IEEE J. Solid-State Circuits, vol. 34, no. 5, pp. 599–606, May 1999

In FIG. 2, the fundamental switch is a transistor 100 whose source terminal is applied by the input voltage Vin and the voltage Vout is outputted from the drain terminal. All the other part thereof is a control circuit. When the transistor 100 is in a turned-on state in this circuit, the operation is such that a voltage between the gate and source of the transistor 100 is kept constant, thereby reducing a dependency of the on-resistance on the input signal voltage and a distortion of the signal induced by the sampling switch.

That is, the electrostatic capacity 101 is charged by the supply source voltage Vdd when the transistor 100 is not turned on. A switching control signal, $\phi$, is low at this time. When the switching control signal $\phi$ is turned to high from low, a transistor 103 is turned off from -on and a transistor 104 is turned on from -off. This causes a transistor 105 to be turned on, the gate voltage of the transistors 100 and 102 become a charged voltage of the capacitance 101, i.e., a voltage basically determined by the supply source voltage Vdd, and the transistors 100 and 102 become turned on. The voltage between the gate and source of the transistor 100 is maintained approximately at the supply source voltage, Vdd.

In the second example of a conventional technique, however, since the output signal outputted from the drain terminal of the transistor 100 is delayed relative to the input signal, voltages at the source terminal and the drain terminal cannot necessarily be considered to change in the same fashion when the input signals change in high speeds. Because a transistor in conduction is regarded as a continuous resistor, the voltage at each part of the channel falls into an approximately intermediate value between the source terminal and drain terminal voltages, and therefore the average voltage in channels becomes an average between the source terminal and drain terminal voltages.

Therefore, although it may be considered that maintaining the gate terminal voltage constant in accordance with the average between the source and drain terminal voltages should suppress a variation of the on-resistance of a transistor to a small value, keeping the voltage between the gate and source unilaterally allows the voltage between the gate and drain to fluctuate in great deal as indicated in the second example of a conventional technique shown by FIG. 2, thus leaving a problem of causing a large distortion added to the signal unresolved. In the meantime, while the on-resistance of a transistor depends on the voltage between the substrate and the source, the problem of reducing a distortion cannot be accomplished by this control because the substrate voltage is actually considered to be maintained at a fixed potential in the second example of a conventional technique shown in FIG. 2.

Such a conventional technique of controlling the gate voltage by using a bootstrap circuit is described in a patent document below, the technique of which has not solved the same problem as with the second example of a conventional technique, however.

[Patent document 1] Japanese patent laid-open application publication 5-151795, "Dynamic input sampling switch used for CDAC"

FIG. 3 shows a sampling switch circuit of a third example of a conventional technique. This circuit is described in the following non-patent document.

[Non-patent document 2] M. Waltari, L. Sumanen, T. Korhonen, K. Halonen: A Self-Calibrated Pipeline ADC with 200 MHz IF-Sampling Frontend, ISSC Digest of Technical Papers, 18.5, February 2002

In the circuit shown by FIG. 3, the fundamental switch is a transistor 100. With the transistor 100 at the center, the same circuit as the control circuit shown in FIG. 2 is featured on both the right and left side thereof. The reason for featuring the circuit on the right is for controlling the substrate terminal voltage of the transistor 100. In this circuit, controlling the substrate voltage of the transistor 100 during its turn-on period by the output signal voltage can reduce a distortion of the signal induced by the switch.

In FIG. 3, a gate voltage control is performed by a bootstrap circuit in accordance with the input voltage Vin and the output voltage Vout in both the right and left circuits. The left circuit is operated so as to raise the gate voltage from the input voltage by a charged voltage of the capacitance 101 on the left, while the right circuit is likewise operated so as to raise the gate voltage from the output voltage Vout by a charged voltage of the capacitance 101 on the right. This seemingly controls the gate voltage evenly by the input and output voltage for the transistor 100, that is, by an intermediate voltage between Vin and Vout, thereby further reducing a distortion induced by the switch.

However, as for controlling a voltage between the substrate and source, a substrate terminal voltage control is performed only by the output signal voltage, leaving the unsolved problem of a small effect on reducing a distortion of signal as compared to a control by the intermediate voltage between the input signal and output signal voltages. Furthermore, the third example of a conventional technique requires the same circuitry of control circuit on both side of the transistor 100, i.e., the fundamental switch, causing a problem of larger circuit area.

SUMMARY OF THE INVENTION

In consideration of the above described problems, an object of the present invention is to control a voltage between the gate and source so as to apply an input voltage by a delayed time according to the delay time of the output voltage from an input voltage and, at the same time, so as to maintain a voltage between the substrate and source constant at approximately zero volt, or independently control a delay of voltage between the gate and source, and a delay of voltage between the substrate and source, thereby reducing a distortion of the signal induced by changes in the on-resistance of a sampling switch and improving the accuracy of analog signal processing.

In order to overcome the object as described above, a sampling switch according to the present invention is the one for sampling an input voltage and providing an output voltage, comprising a MOS transistor in which the aforementioned input voltage is applied to the source terminal and the aforementioned output voltage is provided from the drain terminal; and a gate voltage control unit for supplying a voltage to the gate terminal of the aforementioned MOS transistor at a timing delayed from the input voltage.

BRIEF DESCRIPTION OF THE DRAWINGS

FIG. 9 describes the potential of each node in the first embodiment;

DESCRIPTION OF THE PREFERRED EMBODIMENTS

Figure 1:
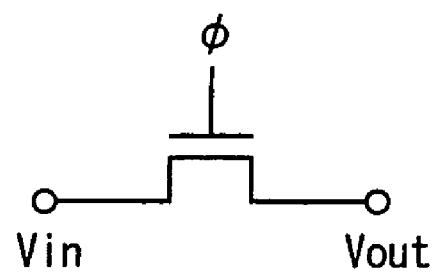
FIG. 1 shows a first example of a conventional sampling switch.
Figure 2:
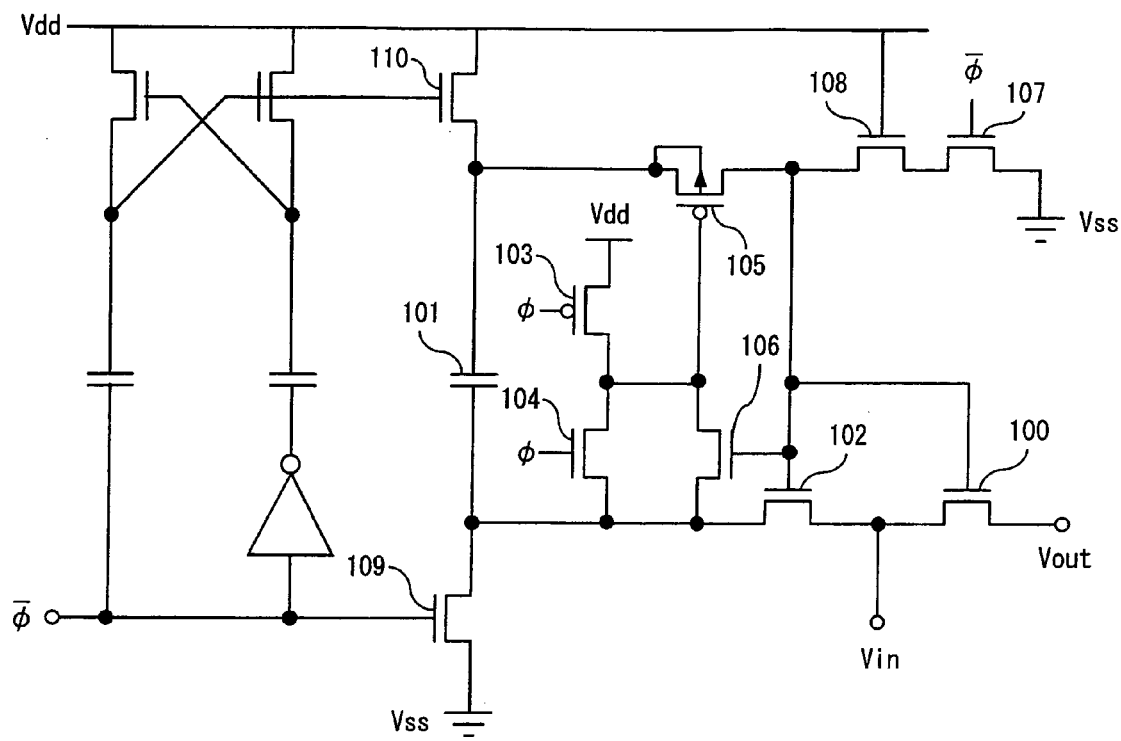
FIG. 2 shows a second example of a conventional sampling switch.
Figure 3:
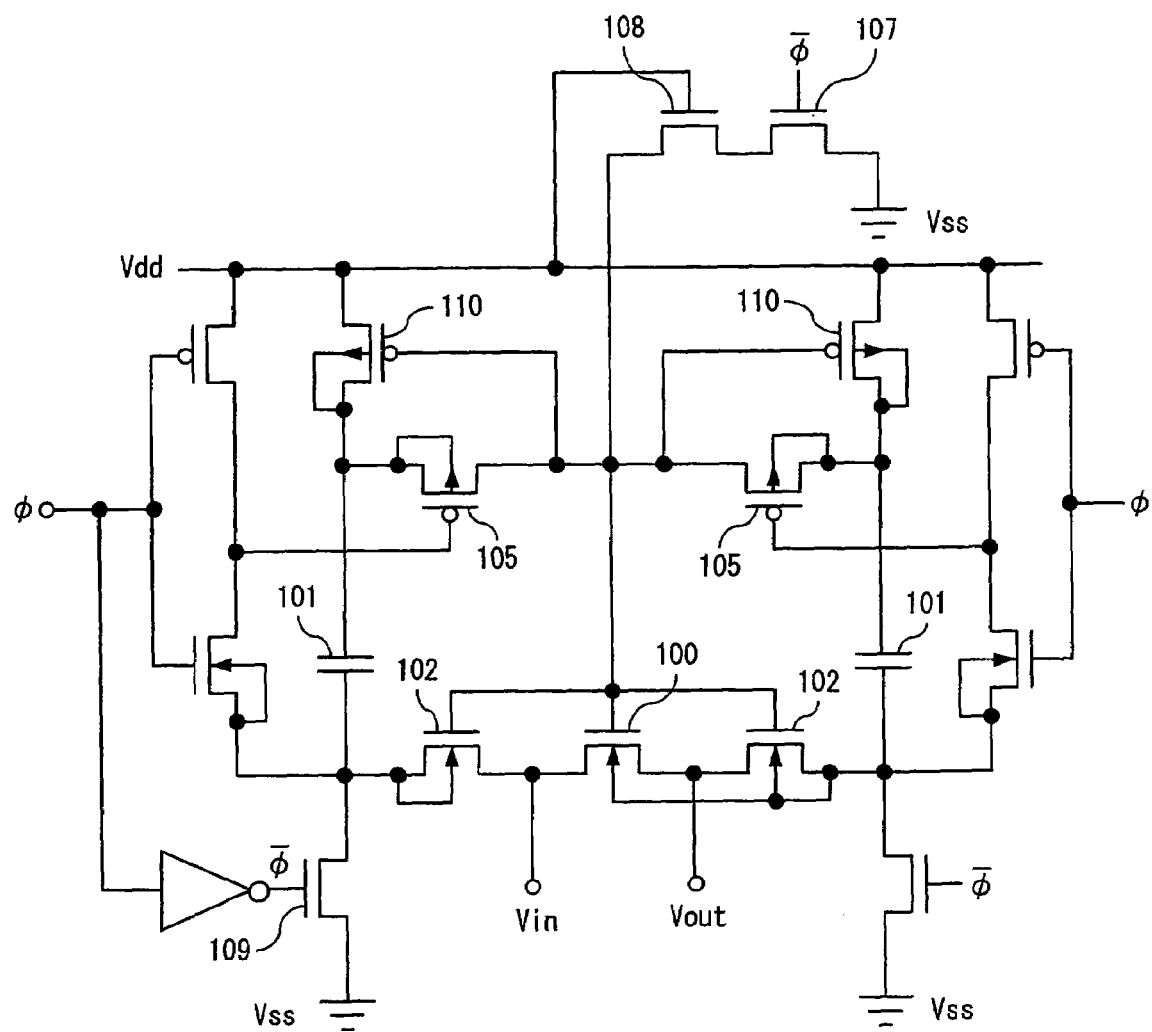
FIG. 3 shows a third example of a conventional sampling switch.
Figure 4:
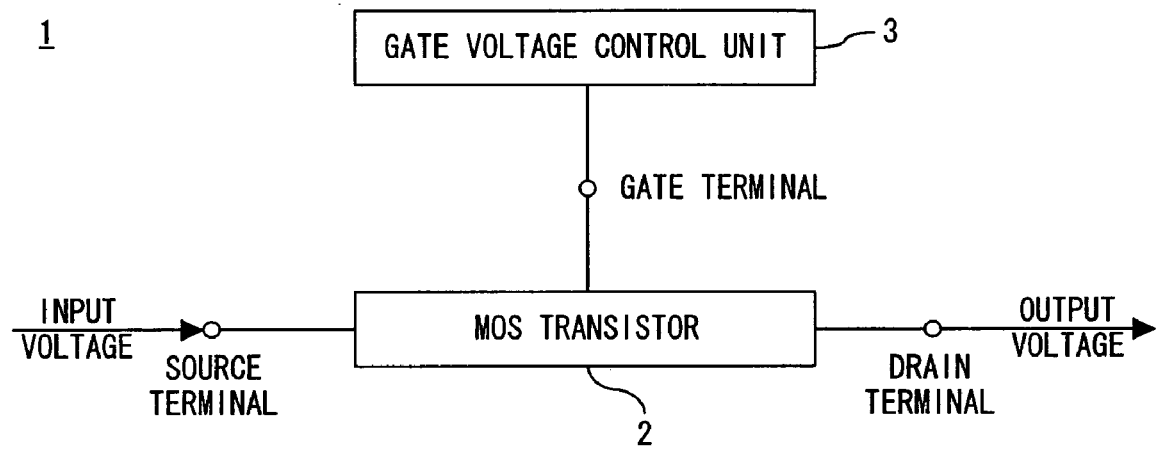
FIG. 4 is a block diagram of principle comprisal of a sampling switch according to the present invention.

FIG. 4 is a block diagram of principle comprisal of a sampling switch according to the present invention. In FIG. 4, the sample switch 1 comprises a MOS transistor 2 and a gate voltage control unit 3. The source terminal of the MOS transistor 2 is applied by an input voltage for the switch, and an output voltage of the switch is outputted from the drain terminal thereof.

The gate voltage control unit 3 supplies a voltage to the gate terminal of the MOS transistor 2 by a delayed time from an input voltage thereto according to the delay time of the output voltage from an input voltage of the MOS transistor 2, for example.

In the present embodiment according to the invention, the gate voltage control unit 3 can also control so as to set the delay time of the gate terminal voltage from an input voltage at half of the delay time of an output voltage from an input voltage.

Also in the present embodiment, the gate voltage control unit 3 can comprise a first capacitance for being charged by a supply source voltage during a period when the sampling switch 1 is supposed to be turned off, having one terminal being connected with the source terminal by way of a first switch unit which is in conduction during a period when the sampling switch 1 is supposed to be turned on and having the other terminal being connected with the gate terminal by way of a second switch unit which is in conduction during a period when the sampling switch 1 is supposed to be turned on, and a second capacitance being connected between the aforementioned one terminal of the first capacitance and a fixed potential; supply a gate terminal voltage with the aforementioned delay time being adjusted by changing a capacitance value of the aforementioned second capacitance; and further can also comprise a wiring for connecting between the substrate terminal of the MOS transistor 2 and the aforementioned one terminal of the first capacitance.

Also in the present embodiment, the gate terminal of the MOS transistor 2 can be connected with a fixed potential during a time when the sampling switch 1 is supposed to be turned off, and the fixed voltage can be a ground potential when the MOS transistor 2 is an NMOS type while it is the supply source potential when the MOS transistor 2 is a PMOS type.

Further in the present embodiment, the substrate terminal of the MOS transistor 2 can also be connected with a fixed potential during a time when the sampling switch 1 is supposed to be turned off, the first and second switches can also comprise MOS transistors, and the aforementioned fixed potential can also be a ground potential when the MOS transistor is an NMOS type while it can also a supply source potential when the MOS transistor is a PMOS type.

Furthermore in the present embodiment, the sampling switch 1 can further comprise a substrate voltage control unit for providing the substrate terminal of the MOS transistor 2 with a voltage delayed from the aforementioned input voltage.

In this case, the substrate voltage control unit can also comprise a third capacitance whose one terminal is connected with the substrate terminal of the MOS transistor 2 and the source terminal thereof by way of a third switch unit which is in conduction during a period when the sampling switch 1 is supposed to be turned on, and the other terminal is connected with a fixed potential; and also adjust the delay time of the substrate terminal voltage from the input voltage to a half of that of the output voltage from the input voltage by adjusting a value of the third capacitance.

Yet furthermore in the present embodiment, each of the aforementioned first, second and third switches can also comprise a MOS transistor; and the aforementioned fixed potential can be the ground potential when the MOS transistors are NMOS type, while it can be a supply source voltage when they are PMOS type.

According to the present invention as described above, first the gate voltage of the MOS transistor 2 is basically controlled at an intermediate value between an input and output voltages. For instance, when a change of signal voltage per a minute time period is approximated linearly, the average between the input and output voltages can be considered to be a voltage as a result of delaying the input voltage by a half of a delay time of the output voltage from an input voltage. That is, by controlling the gate voltage delayed as half much as the delay time thereof from an input voltage, the gate terminal voltage will actually be controlled at a constant voltage difference relative to the average between the input and output voltages. Also, by maintaining the voltage between the substrate and the source constant at approximately zero volt in this case, a change in the on-resistance of transistor will become even smaller. Alternatively, by controlling a voltage applied to the substrate terminal in the same delay time as with the gate terminal voltage, and independent of the voltage between the gate and source, a change in the on-resistance can be further decreased.

Figure 5:
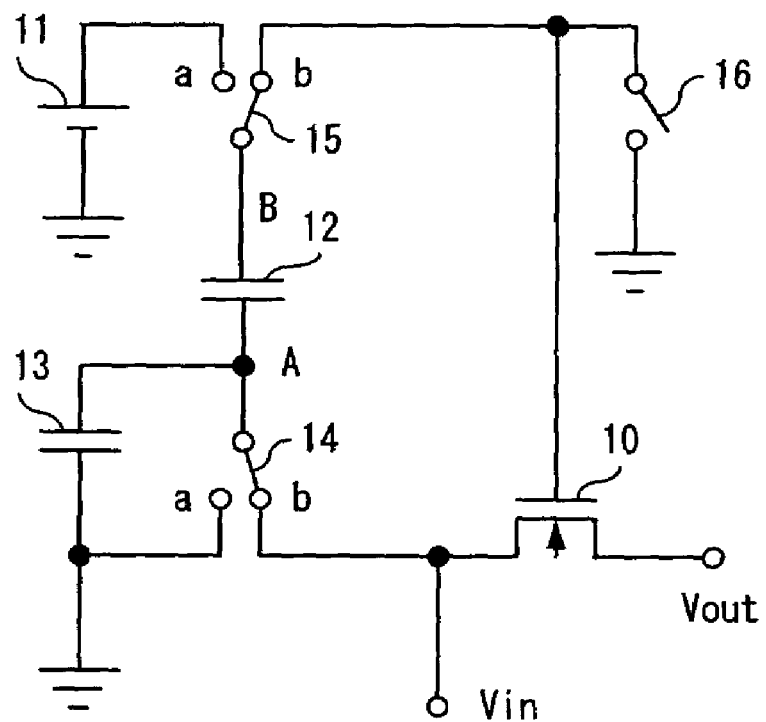
FIG. 5 shows a basic circuit of a sampling switch according to a first embodiment.

FIG. 5 shows a basic circuit configuration of a sampling switch according to a first embodiment of the present invention. In FIG. 5, the sampling switch comprises a MOS transistor 10 for being applied by an input voltage Vin to the source terminal thereof and outputting an output voltage Vout from the drain terminal thereof, a supply source 11, capacitances 12 and 13, and switches 14, 15 and 16. These elements except for the MOS transistor 10 constitute a gate voltage control unit noted in claims of the present invention.

The first embodiment is an embodiment enabling a control circuit comprising a bootstrap circuit for controlling a gate terminal voltage of the MOS transistor 10 to control a delay time of the gate terminal voltage relative to an input voltage Vin in accordance with a delay time of the output voltage Vout relative to the input voltage Vin.

In FIG. 5, when the input voltage Vin is applied to the source terminal, the MOS transistor 10 is not in conduction, i.e., turned off, then the switches 14 and 15 each is switched to the respective terminal "a," contrary to the showing of FIG. 5, and the switch 16 is turned on. In this state, the capacitance 12 (which corresponds to a first capacitance noted in claims of the present invention) is charged to the voltage of the supply source 11.

From this state, the switches 14 and 15 (corresponding to a first and second switch units noted in claims of the present invention) each is switched to the terminal "b" by a not-shown switching control signal and the switch 16 is turned off, then the gate terminal of the MOS transistor 10 is applied by the voltage of the one across the capacitance 12 plus the input voltage Vin, turning on the MOS transistor 10 and hence outputting an output voltage Vout corresponding to the input voltage Vin from the drain terminal.

In this state, the voltage component of the gate terminal voltage made up by the input voltage Vin added to the voltage across the capacitance 12 corresponds to delaying the input voltage by a time constant which is determined by the on-resistance of the switch 14 and the sum of capacitance of the terminal (i.e., node A) on the lower side of the capacitance 12, i.e., the parasitic capacitance of the terminal itself, and the capacitance 13 (corresponding to a second capacitance noted in claims of the present invention). By adjusting the value of the capacitance 13 so as to make the delay time a half of that of the output voltage from the input voltage, it is possible to make the delay time of the gate terminal voltage (a change thereof) from the input voltage Vin (a change thereof) a half of that of the output voltage from the input voltage. That is, when an input voltage changes linearly with time for example, the gate voltage is actually controlled at the average between the input and output voltages, and therefore an optimum control for the gate terminal voltage is accomplished for reducing a distortion of the signal induced by the switch.

Meanwhile, in FIG. 5, the three switches 14, 15 and 16 are configured by the MOS transistors as described later, and the details including their operations will be described later.

Figure 6:
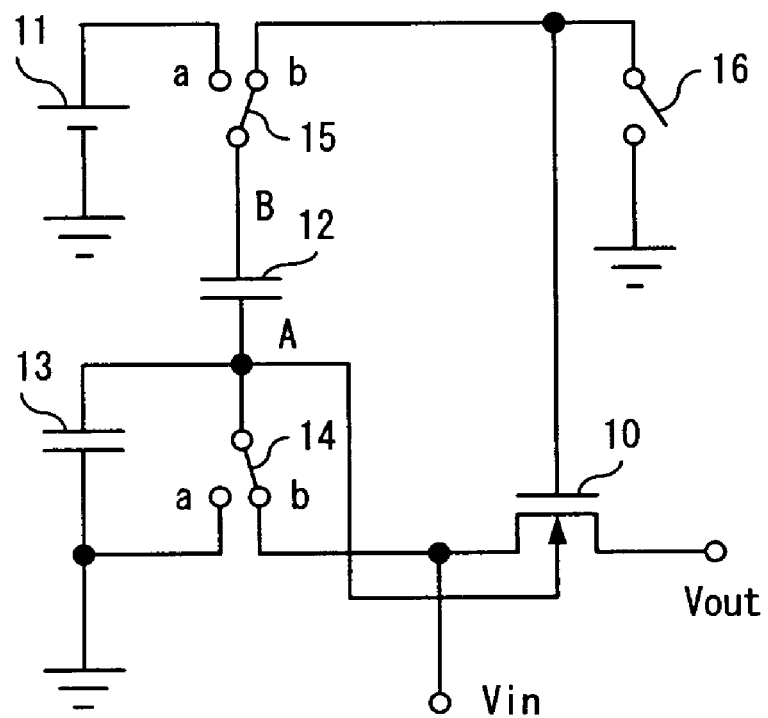
FIG. 6 shows a basic circuit of a sampling switch according to a second embodiment.

FIG. 6 shows a basic circuit configuration of a sampling switch according to a second embodiment. Comparing FIG. 6 with the first embodiment shown by FIG. 5, the only difference is that the substrate terminal of the MOS transistor 10 which is applied by the input voltage Vin to the source terminal thereof and outputting the output voltage Vout from the drain terminal thereof, is connected to the connection point (i.e., node A) between the capacitances 12 and 13. Meanwhile, while a connection point of the substrate terminal of the MOS transistor is not shown in FIG. 5, the NMOS transistors rather than the PMOS transistors are basically used in the embodiments of the present invention in preference of better conductivity of the former unless otherwise note herein, and therefore the substrate terminal of the MOS transistor 10 is supposed to be generally connected with a ground potential Vss in FIG. 5.

In the second embodiment shown by FIG. 6, a voltage between the substrate and source is maintained constant at approximately zero volt by the switch 14 actually connecting the substrate and source terminals of the MOS transistor 10. This enables the voltage between the substrate and source to be maintained approximately constant, in addition to the voltage between the gate and source and that across the gate and drain in the state of the sampling switch being in conduction, thereby further decreasing a change in the on-resistance of the transistor and therefore a distortion of signals induced by the sampling switch.

While the same effect is gained for the gate terminal voltage control of the MOS transistor 10 as the first embodiment shown by FIG. 5, a capacitance value of the capacitance 13 must be controlled at a smaller value in comprehension of a parasitic capacitance of the substrate terminal since the substrate terminal of the transistor 10 is connected to the node A as shown by FIG. 6.

Figure 7:
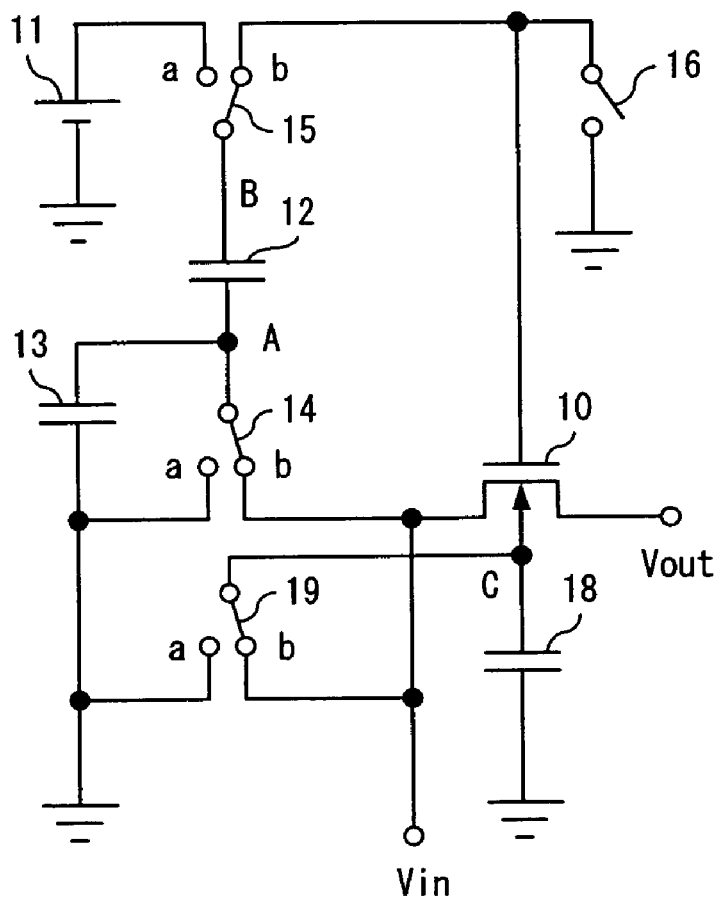
FIG. 7 shows a basic circuit of a sampling switch according to a third embodiment.

FIG. 7 shows a basic circuit configuration of a sampling switch according to a third embodiment. Comparing FIG. 7 with the second embodiment shown by FIG. 6, the difference is that the substrate terminal of the MOS transistor 10 is connected by a capacitance 18 and a switch 19 constituting a substrate voltage control unit noted in claims of the present invention. The other terminal of the capacitance 18 (corresponding to a third capacitance noted in claim of the present invention) is connected with the ground, and the switch 19 is connected with a terminal "b" (corresponding to a third switch unit noted in claim of the present invention), i.e., the input voltage Vin, during a time when the MOS transistor 10 is turned on, while the switch 10 is connected with the terminal "a," i.e., the ground, during a time when the MOS transistor is turned off.

In the third embodiment shown by FIG. 7, the same control is possible for the gate voltage control of the MOS transistor 10 as the first embodiment. In addition, in FIG. 7, it is possible to control the substrate terminal voltage independent of the gate voltage control because the input voltage is applied to the substrate terminal of the MOS transistor 10 by way of the switch 19. And in this case, by the capacitance 18 being connected with the substrate terminal, a delay time of the substrate terminal voltage from an input voltage Vin is determined in accordance with a time constant which is determined by the on-resistance of the switch 19 and the capacitance of the node C, i.e., the sum of the parasitic capacitance of the substrate terminal of the transistor 10 and the capacitance of the capacitance 18, thereby enabling for example a delay time of the substrate terminal voltage from the input voltage to be adjusted to a half of that of the output voltage from the input voltage by adjusting the value of the capacitance 18 and further reducing a distortion of signals induced by the switch.

Figure 8:
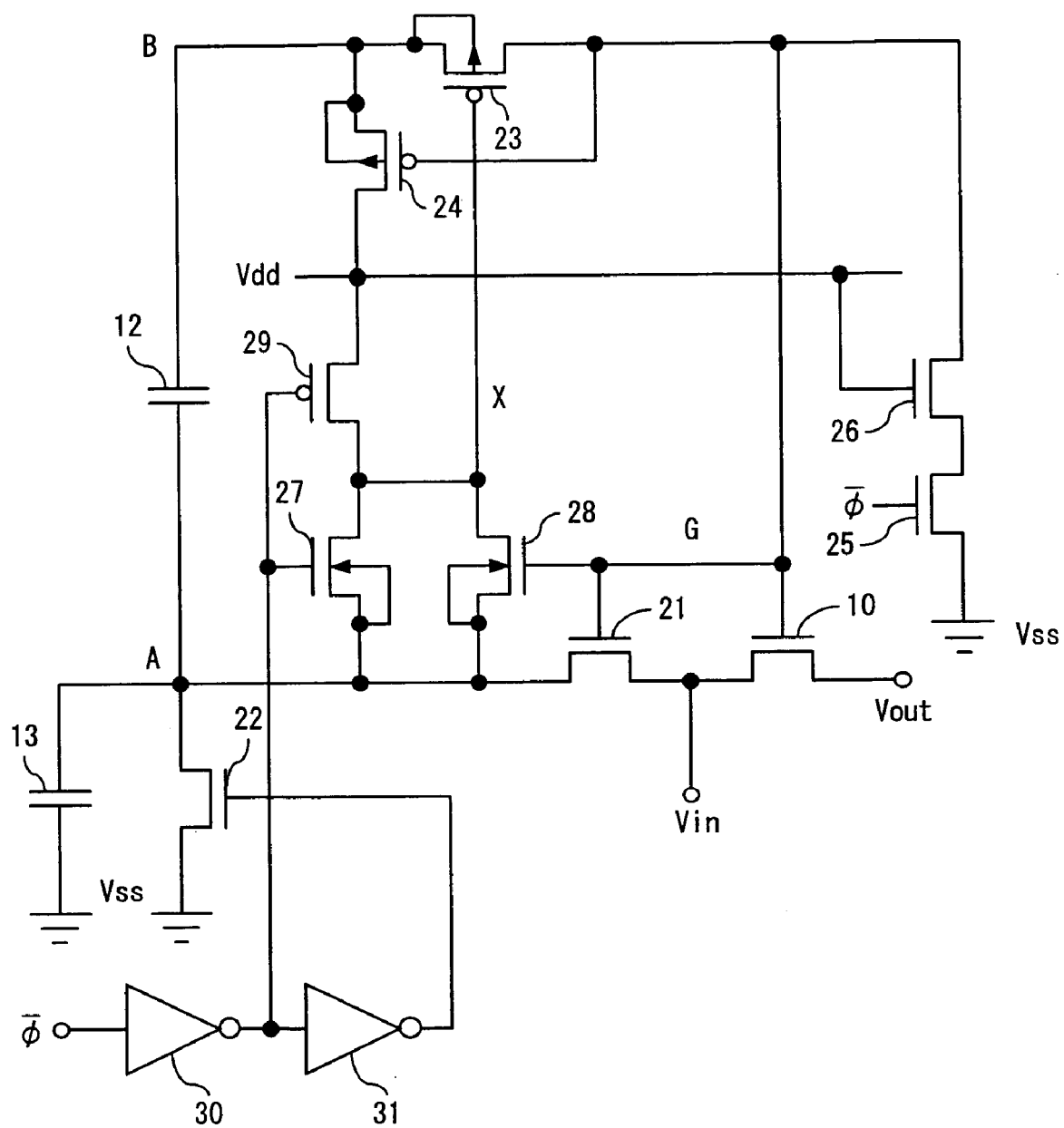
FIG. 8 shows a detailed circuit according to the first embodiment.

FIG. 8 shows a detailed configuration of circuit of the first embodiment corresponding to the basic circuit shown by FIG. 5. In FIG. 8, a (MOS) transistor 21 corresponds to the terminal "b" of the switch 14 shown in FIG. 5, while a transistor 22 corresponds to the terminal "a" therein. And a transistor 23 corresponds to the terminal "b" of the switch 15, while a transistor 24 corresponds to the terminal "a" shown in FIG. 5, respectively. And likewise a transistor 25 corresponds to the switch 16.

The other components herein are added for controlling or protecting these switches, including inverters 30 and 31 being equipped in a double-step and being given a signal, Not φ, for switching-control of the sampling switch, a transistor 26 connected between the transistors 23 and 25, two transistors 27 and 28 being connected in parallel between the gate terminal (negative logic) of the transistor 23 and the source terminal (i.e., node A) of the transistor 21 and a transistor 29 being connected between the transistors 24 and 27.

Operations of the sampling switch shown by FIG. 8 according to the first embodiment are described in further detail as follows. Let it be known here that the transistor 10 is turned off when the value of the switching control signal, Not φ, is high, while it is turned on when the aforementioned signal is low.

First the operation of the circuit when the transistor 10 is turned off is described as follows. At this time, an output of the inverter 30 is low, while that of the inverter 31 is high, turning on the transistor 22 and grounding the node A to Vss. Although not shown as described above, the substrate terminal of the transistor 10 is grounded to Vss.

Having been given a switching control signal, Not φ, being high to the gate terminal, the transistor 25 is turned on, the node G is grounded, and the transistors 10 and 21 are turned off, while the transistor 24 is turned on, and the capacitance 12 is charged to the supply source voltage Vdd.

At this time, the gate of the transistor 29 is provided with a low level output of the inverter 30, turning on the transistor 29, making the potential of the node X at Vdd and leaving the transistor 23 turned off. And, the gate voltage of the transistors 27 and 28 low are left at low, hence leaving both these transistors turned off.

Then, a description is given to show operations of the sampling switch, i.e., the transistor 10, of which the transition from being turned off to -on with the switching control signal, Not φ, turning to low. The switching control signal, Not φ, by changing to low, makes the inverter 30 output high and the inverter 31 output low. At this time, both the transistors 22 and 25 are turned off. Meanwhile, the gate voltage of the transistor 27 is turned to high, turning on the transistor 27 and turning the nodes X into conduction with -A.

Accordingly, the voltage between the nodes X and -B as the voltage between the gate and source of the transistor 23 becomes equal to a supply source voltage, in the absolute value, at the time when the transistor 10 was turned off and the capacitance 12 was charged, thereby turning on the transistor 23 and the nodes G into conduction with -B.

This makes the voltage between the gate and source of the transistor 21 become equal to the charged voltage of the capacitance 12, i.e., approximately the same as the supply source voltage, thus turning on the transistor 21. At this time, since the source terminal being supplied with the input voltage and the node A becomes in conduction through the transistor 21, and therefore the potential of the node G becomes maintained at the sum of the input voltage Vin and the supply source voltage Vdd. This of course makes the transistor 10 turned on in the same way as the transistor 21.

By maintaining the node G potential approximately at the sum of the input and supply source voltages, the voltage between the gate and source of the transistor 10 will actually be maintained approximately at constant during a period of the transistor 10 being turned on, thereby reducing a dependency of the on-resistance of the sampling switch on input signal voltage. And at this time, although the potentials at nodes B and -G can become higher than that of the supply source level in accordance with the input signal voltage, the existence of the transistor 26 limits the voltage between the gate and drain of the transistor 25 up to the supply source voltage, hence securing a reliability of transistor elements.

FIG. 9 shows the potential at each node in both turned on and -off states of the transistor 10 described above. In FIG. 9, the potential of each node is shown under the assumption that the level high of the switching control signal, Not φ, corresponds to the supply source voltage Vdd, while the level low thereof corresponds to the ground potential Vss.

Further described below is the operations of the circuit when the sampling switch changes to the turn-off state through the switching control signal, Not φ, changing back to the supply source level, i.e., high, in the detailed circuit of the first embodiment shown by FIG. 8. In this embodiment, the operation control is such that especially the timing of turning off the transistor 22 is later than that of turning on the transistor 25 by controlling the gate voltage of each transistor through a two-stage connection of the inverters 30 and 31, thus shortening a period when the transistors 10, 21 and 22 are simultaneously in the turned-on state.

The reason is, if the transistors 10 and 21 are in the turned-on states when the transistor 22 is in transition to a turned-on state, the output voltage Vout of the sampling switch is forced to change by a change in the node-A potential, thereby causing errors in voltage subjected to sampling. Therefore it is preferable to have either zero or the shortest possible time period in which the transistors 10, 21 and 22 are simultaneously in the turned-on state.

In FIG. 8, when the switching control signal, Not φ, changes to high, first the transistor 25 is turned on and the node-G potential starts descending to the grounded voltage Vss. This causes to turn off the transistors 10 and 21 when each of the voltage between the gate and source of respective transistors goes below the respective threshold voltage. As described above, as the transistor 22 is turned on, the node-A potential starts descending toward the ground potential Vss, and if the transistors 10 and 21 are in the turned-off states at this stage, the output voltage will not be affected by a change in the node-A potential, thus enabling an improved sampling accuracy performed by the sampling switch.

Figure 10:
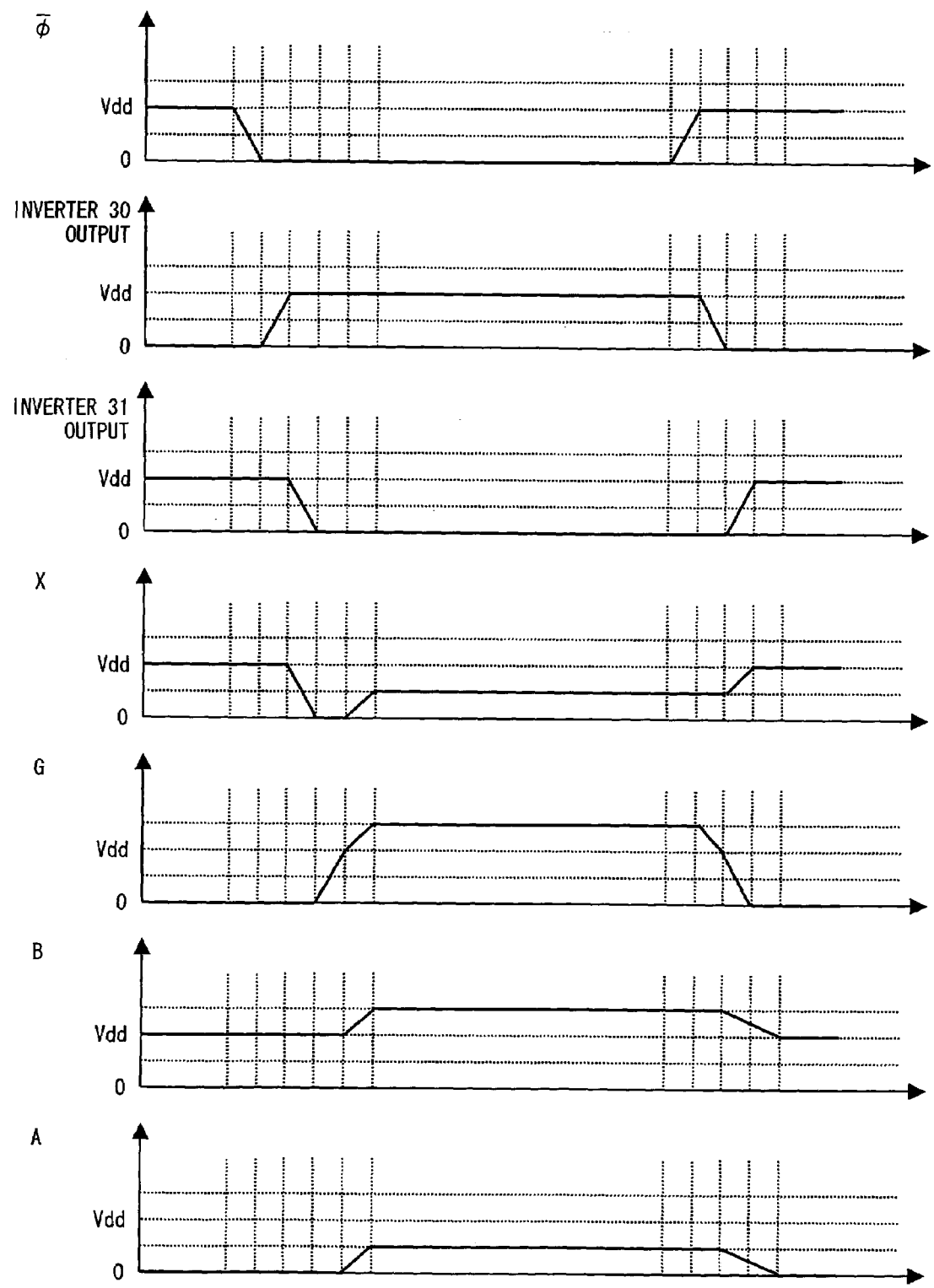
FIG. 10 is a time chart showing an operation of the first embodiment.

FIG. 10 shows a series of time chart for the first embodiment shown by FIG. 8, including the switching control signal, the outputs of the inverter 30 and 31, and the potential change at each of the nodes-X, -G, -B and -A. The circuit shown by FIG. 8 is an analog circuit which is unable to describe the operation in correspondence with the clock in the same way as a digital circuit, FIG. 10, however, shows in a manner to describe the change timings corresponding to the clock for simplicity. Meanwhile, the input voltage is an analog signal causing a problem for the present invention, i.e., a switch-induced distortion in the signal due to a change in value of the aforementioned analog signal, FIG. 10, however, delineates a time chart assuming the input voltage Vin is maintained at a half of the supply source voltage Vdd, again for simplicity.

In FIG. 10, when a value of the switching control signal, Not φ, changes from high to low, that is, it changes from Vdd to zero volt, the inverter output increases from zero volt to Vdd and then the inverter output decreases from Vdd to zero volts. Approximately simultaneously, the node-X potential descends from Vdd to zero volts. Then the node-G potential ascends from zero volt to Vdd, followed by ascending to 3*Vdd/2. At this moment the node-B potential also ascends to 3*Vdd/2, and both the potentials of the node-X and -A ascends from zero volt to Vdd/2.

Subsequently, the switching control signal, Not φ, changes from zero to Vdd, followed by the inverter 30 output decreasing to zero volt, further followed by the inverter 31 output increasing to Vdd. As the switching control signal, Not φ, increases to Vdd, the node-G potential starts ascending and falls to zero volt after a time. During the aforementioned process, the node-X potential ascends to Vdd, while the node-A and -B potentials each starts descending and the node-A potential falls to zero volt, while the node-B voltage to Vdd, after a time. Note that the reason for the node-A and node-B taking time to change (i.e., descend) potential at this time is that the node-G potential changes to zero volt, turning off both the transistors 10 and 21, followed by turning on the transistor 22, as described above in relation with FIG. 8.

Figure 11:
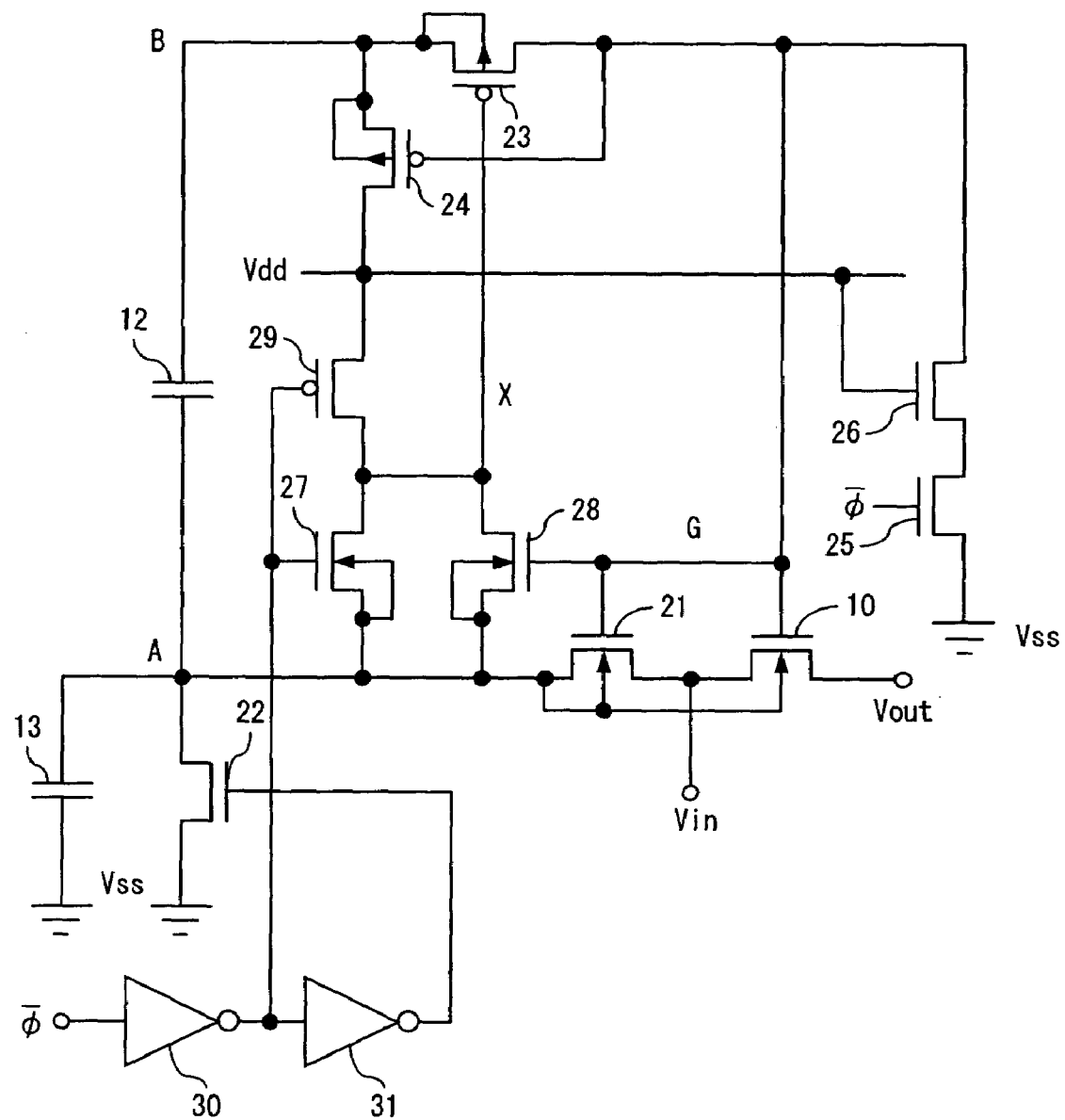
FIG. 11 shows a detailed circuit of the second embodiment.

FIG. 11 shows a detailed circuit of the second embodiment corresponding to the basic circuitry shown by FIG. 6. Comparing FIG. 11 with the first embodiment shown by FIG. 8, the only difference is that the substrate terminals of the transistors 10 and 21 each is respectively connected with the node-A. In the second embodiment as described above, by connecting the substrate terminal of the transistor 10 with the node-A which is in conduction with the input voltage terminal, the voltage between the substrate and source of the transistor 10 is maintained constant approximately at zero volt in the state of the transistor 10 being turned on, i.e., the sampling switch being in conduction, hence reducing an effect of input signal voltage on the on-resistance of the sampling switch better than the first embodiment.

Figure 12:
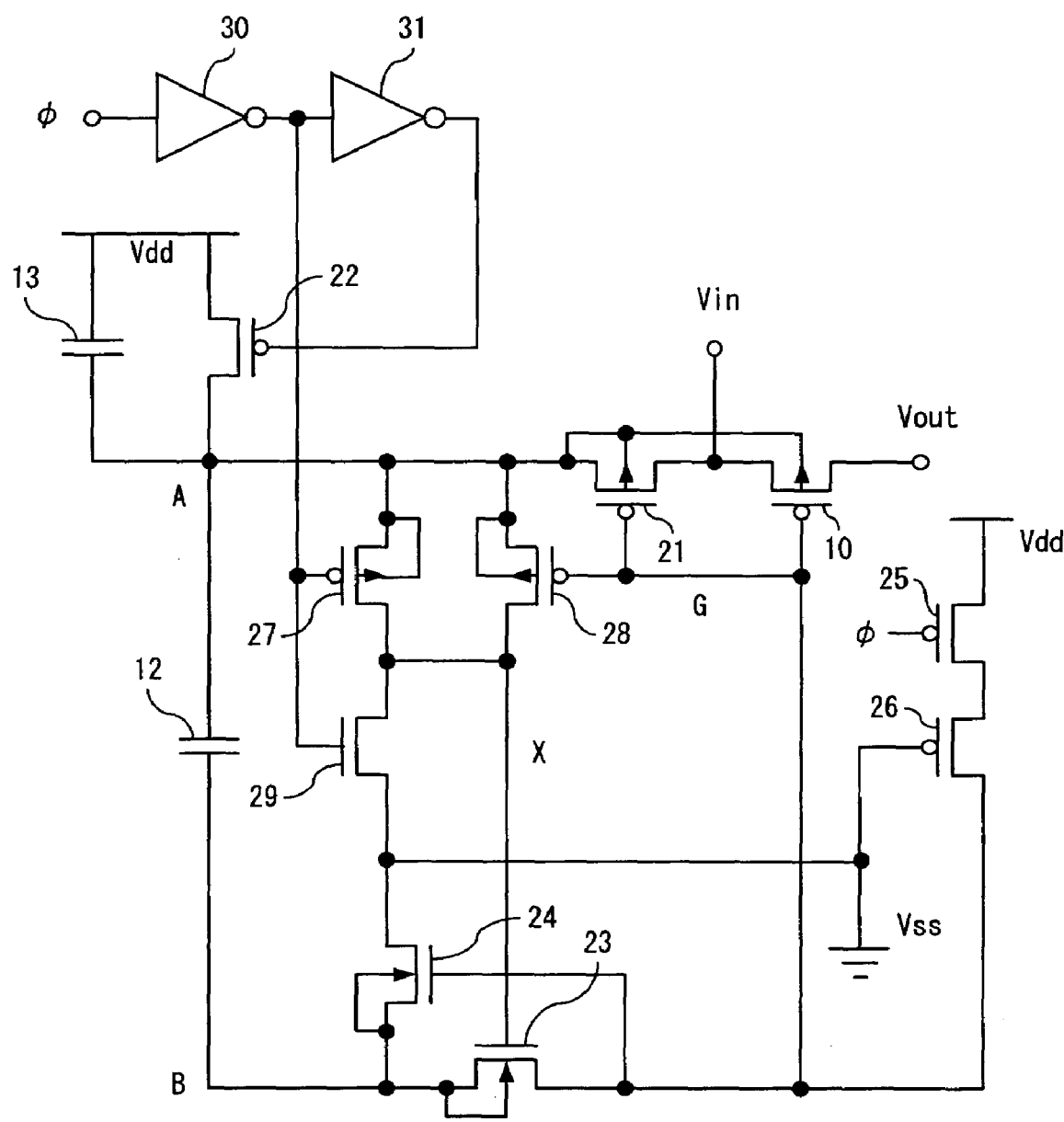
FIG. 12 shows a circuit of the second embodiment comprising a PMOS transistor.

FIG. 12 is a detailed circuitry of the second embodiment comprising a PMOS transistor in place of an NMOS transistor. In FIG. 12, the basic voltage characteristics are reversed, replacing between a supply source voltage Vdd and a grounded voltage Vss with each other. And a reversed-pole switching control signal, φ, is used in place of the Not φ. Since the NMOS transistor in general has a smaller resistance per channel bandwidth than the PMOS transistor, being capable of high speed operations, these embodiments according to the present invention are described mainly by using the NMOS transistors, the sampling switch according to the present invention, however, is not only applicable to the NMOS transistors, but also to the PMOS transistors of course.

Figure 13:
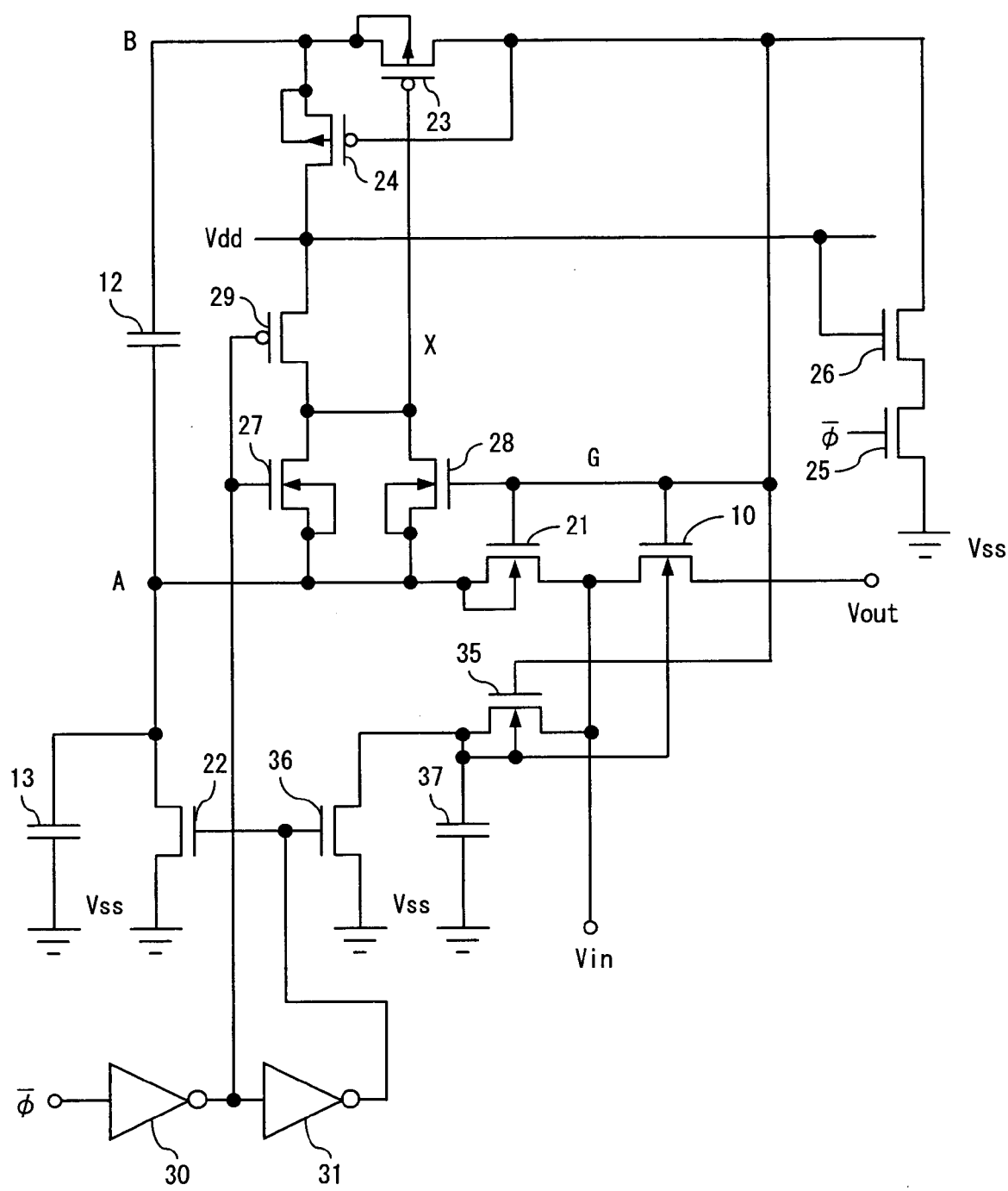
FIG. 13 shows a detailed circuit of the third embodiment.

FIG. 13 shows a detailed circuitry of a third embodiment corresponding to the basic circuit shown by FIG. 7. Comparing FIG. 13 with, for example, FIG. 11 showing the second embodiment, the substrate terminal of the transistor 21 is connected with the node-A as in FIG. 11, however, an input voltage Vin is applied to the drain terminal for controlling the substrate terminal voltage of the transistor 10 and three elements are added, i.e., a transistor 35 whose source and substrate terminals are inter-connected and connected with the substrate terminal of the transistor 10, a transistor 36 being provided by an output of the inverter 31 to the gate thereof and an capacitance 37 being connected with the substrate terminals of the transistors 10 and 35.

In the third embodiment shown by FIG. 13, the transistor 35 corresponds to the terminal "b" of the switch 17, the transistor 36 corresponds to the terminal "a" thereof, and the capacitance 37 corresponds to the capacitance 18, each corresponded element respectively shown by FIG. 7. By this configuration, during a time of the transistor 10 being turned off, the transistor 35 is turned on and the substrates of transistors 10 and 35 are both at the ground potential Vss.

Contrarily, during a time of the transistor 10 being turned on, the transistor 35 is turned on, and the transistor 10 is applied, as the substrate terminal voltage thereof, by an input voltage Vin with a delay time according to a time constant determined by the on-resistance of the transistor 35 and the capacitance of node-C, i.e., the sum of the parasitic capacitance of the node-C and the capacitance of the capacitance 37.

Figure 14:
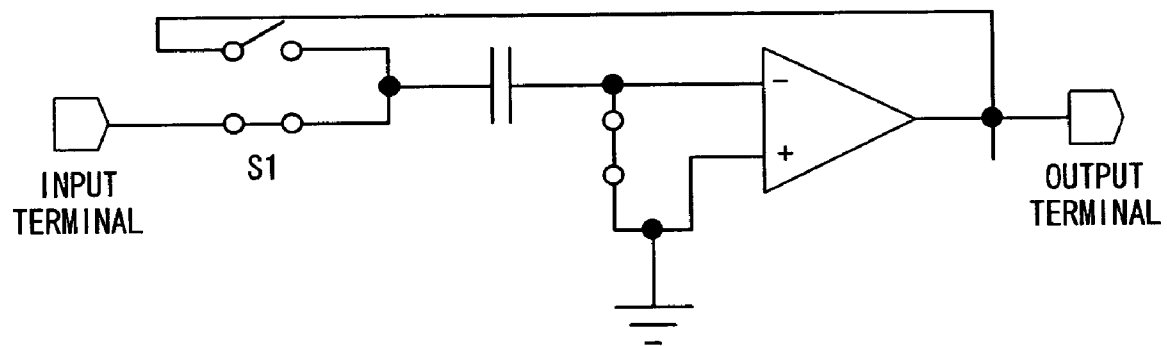
FIG. 14 shows an example of a sample hold circuit using a sampling switch according to the present invention.

FIG. 14 shows an example of a sample hold circuit as an exemplified embodiment of a sampling switch according to the present invention. A sample hold circuit is a circuit sampling input signals and subsequently holding a sampling voltage, and is widely used, such as a signal input part of an A/D converter. The operation states, that is, a sampling phase and a holding phase, are switched by a control clock, and the circuit will be operated by the aforementioned phases are alternatively switched. In FIG. 14, by using a sampling switch of the present invention as a switch S1, it is possible to configure a sample hold circuit having a reduced distortion of signal as compared to a conventional sampling switch. Note that FIG. 14 currently shows the sampling phase for all three switches including the sampling switch S1, while each switch will be in a reversed state, with the switch S1 being turned off for example, in the holding phase.

As described in details above, the present invention enables a change in the on-resistance of a MOS transistor used for a sampling switch to be suppressed to a minimum, thereby reducing a distortion of signals induced by a change in the on-resistance. The advantageous effect will be increased with lower voltage operations of circuits and development of higher signal speeds, and in addition, enable more compact circuit dimension and therefore contribute in great deal to the applicability of sampling switches for the analog signal processing.

What is claimed is:

1. A sampling switch for sampling an input voltage and providing an output voltage, comprising:
 a MOS transistor for being supplied by the input voltage to the source terminal thereof and providing the output voltage from the drain terminal thereof; and
 a gate voltage control unit for supplying a voltage to the gate terminal of the MOS transistor with a delayed time from the input voltage in such a way that a delay time of said gate terminal voltage from the input voltage becomes substantially a half of a delay time of said output voltage from the input voltage.

2. The sampling switch according to claim 1, wherein the gate terminal of said MOS transistor is connected with a fixed potential during a period when said sampling switch is supposed to be turned off.

3. The sampling switch according to claim 2, wherein said fixed potential is a ground potential when said MOS transistor is an NMOS type, and said fixed potential is a supply source potential when said MOS transistor is a PMOS type.

4. A sampling switch for sampling an input voltage and providing an output voltage, comprising:
 a MOS transistor for being supplied by the input voltage to the source terminal thereof and providing the output voltage from the drain terminal thereof; and
 a pate voltage control unit for supplying a voltage to the gate terminal of the MOS transistor with a delayed time from the input voltage, wherein said gate voltage control unit comprises:
 a first capacitance for being charged by a supply source voltage during a period when said sampling switch is supposed to turned off, having one terminal thereof being connected with said source terminal by way of a first switch unit which is in conduction during a period when the sampling switch is supposed to be turned on, and having the other terminal thereof being connected with said gate terminal by way of a second switch unit which is in conduction during the period when the sampling switch is supposed to be turned on; and
 a second capacitance being connected between the aforementioned one terminal of the first capacitance and said fixed potential; and
 supplies a gate terminal voltage with said delay time being adjusted by changing a capacitance value of the second capacitance.

5. The sampling switch according to claim 4, further comprising a wiring for connecting the substrate terminal of said MOS transistor and said one terminal of said first capacitance.

6. The sampling switch according to claim 5, wherein said substrate terminal is connected with said fixed potential during a period when said sampling switch is supposed to be turned off.

7. The sampling switch according to claim 6, wherein said fixed potential is a ground potential when said MOS transistor is an NMOS type and said fixed potential is a supply source potential when the MOS transistor is a PMOS type.

8. The sampling switch according to claim 4, wherein said first and second switch units each comprises a MOS transistor.

9. The sampling switch according to claim 8, wherein said fixed potential is a ground potential when said MOS transistor is an NMOS type and said fixed potential is a supply source potential when the MOS transistor is a PMOS type.

10. In the sampling switch according to claim 4, a substrate voltage control unit is further comprised for supplying a voltage delayed from said input voltage to the substrate terminal of said MOS transistor.

11. The sampling switch according to claim 10, wherein said substrate voltage control unit comprises:
 a third capacitance having one terminal thereof being connected with the substrate terminal of said MOS transistor and with said source terminal by way of a third switch unit which is in conduction during a period when the sampling switch is supposed to be turned on, and the other terminal thereof being connected with a fixed potential.

12. The sampling switch according to claim 11, wherein said substrate voltage control unit adjusts a delay time of a substrate terminal voltage from said input voltage by adjusting a capacitance value of said third capacitance.

13. The sampling switch according to claim 11, wherein each of said first, second and third switch units comprises a MOS transistor.

14. The sampling switch according to claim 13, wherein said fixed potential is a ground potential when said MOS transistor is an NMOS type and said fixed potential is a supply source potential when the MOS transistor is a PMOS type.

15. The sampling switch according to claim 10, wherein said substrate voltage control unit controls a delay time of said substrate terminal voltage from the input voltage at a half of that of said output voltage from the input voltage.

16. A sampling switch for sampling an input voltage and providing an output voltage, comprising:
 a MOS transistor for being supplied by the input voltage to the source terminal thereof and providing the output voltage from the drain terminal thereof; and gate voltage control means for supplying a voltage to the gate terminal of the MOS transistor with a delayed time from the input voltage, wherein said gate voltage control means comprises:
 a first capacitance means for being charged by a supply source voltage during a period when said sampling switch is supposed to be turned off, having one terminal thereof being connected with said source terminal by way of a first switch means which is in conduction during a period when the sampling switch is supposed to be turned on, and having the other terminal thereof being connected with said gate terminal by way of a second switch means which is in conduction during the period when the sampling switch is supposed to be turned on; and
 a second capacitance means being connected between the aforementioned one terminal of the first capacitance means and said fixed potential; and
 supplies a gate terminal voltage with said delay time being adjusted by changing a capacitance value of the second capacitance means.

* * * * *